(12) United States Patent
Goto

(10) Patent No.: US 6,696,835 B2
(45) Date of Patent: Feb. 24, 2004

(54) SECOND-ORDER STATIC MAGNETIC FIELD CORRECTING METHOD AND MRI APPARATUS

(75) Inventor: Takao Goto, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 106 days.

(21) Appl. No.: 09/963,824

(22) Filed: Sep. 26, 2001

(65) Prior Publication Data

US 2002/0089328 A1 Jul. 11, 2002

(30) Foreign Application Priority Data

Nov. 21, 2000 (JP) ........................................ 2000-354862

(51) Int. Cl.[7] ................................................. G01V 3/00
(52) U.S. Cl. ........................................ 324/307; 324/309
(58) Field of Search ................................ 324/309, 307, 324/320, 318, 322; 335/299; 128/653.1; 600/410

(56) References Cited

U.S. PATENT DOCUMENTS 4,701,736 A * 10/1987 McDougall et al. ........ 335/299
5,173,661 A * 12/1992 Knuttel et al. ............... 324/309
5,650,724 A * 7/1997 Yamagata .................... 324/320
6,483,305 B1 * 11/2002 Miyamoto ................... 324/307

FOREIGN PATENT DOCUMENTS

WO        WO 94/01785      *  1/1994

* cited by examiner

Primary Examiner—Brij B. Shrivastav
(74) Attorney, Agent, or Firm—Moonray Kojima

(57) ABSTRACT

For the purpose of reducing second-order static magnetic field components in an MRI apparatus, a first circular loop coil C1 and a second circular loop coil C2 are disposed at positions spaced in a static magnetic field B0 direction to be symmetrical with respect to a center Z0 of an imaging region of an MRI apparatus 100. Similarly, a third circular loop coil C3 and a fourth circular loop coil C4 are disposed. A first corrective magnetic field bz1 and a second corrective magnetic field bz2 are generated in the same direction by the first and second circular loop coils C1 and C2, and a third corrective magnetic field bz3 and a fourth corrective magnetic field bz4 are generated in the same direction and opposite to the first corrective magnetic field bz1 by the third and fourth circular loop coils C3 and C4. The second-order components of the static magnetic field B0 are corrected by the corrective magnetic fields bz1–bz4.

16 Claims, 8 Drawing Sheets

1P1, 1P2, 1P3

SECOND-ORDER STATIC MAGNETIC FIELD CORRECTING METHOD AND MRI APPARATUS

BACKGROUND OF THE INVENTION

The present invention relates to a second-order static magnetic field correcting method and an MRI (magnetic resonance imaging) apparatus, and more particularly to a second-order static magnetic field correcting method for correcting second-order static magnetic field components to improve homogeneity in an MRI apparatus and an MRI apparatus that can implement the method.

The static magnetic field of an MRI apparatus should be homogeneous. Homogeneity of the static magnetic field is achieved by mechanical shimming or by adding small pieces of magnet, iron or the like.

A metal mass (e.g., an automobile) moving near the MRI apparatus or an environment change (e.g., a change in temperature) varies the static magnetic field, and second-order static magnetic field components are generated.

Pulse sequences that observe gradient echoes, such as one according to GRASS (gradient recalled acquisition in the steady state) or SPGR (spoiled GRASS), are very sensitive to the static magnetic field components, and the generation of the second-order static magnetic field components leads to degradation of image quality.

SUMMARY OF THE INVENTION

It is therefore an object of the present invention to provide a second-order static magnetic field correcting method for correcting second-order static magnetic field components to improve homogeneity and an MRI apparatus that can implement the method.

In accordance with its first aspect, the present invention provides a second-order static magnetic field correcting method characterized in: disposing a first circular loop coil and a second circular loop coil at positions spaced in a static magnetic field direction to be symmetrical with respect to a center of an imaging region of an MRI apparatus; disposing a third circular loop coil and a fourth circular loop coil having a larger diameter than that of said first and second circular loop coils at positions spaced in the static magnetic field direction to be symmetrical with respect to the center of said imaging region; generating a first corrective magnetic field and a second corrective magnetic field in the same direction by said first and second circular loop coils; and generating a third corrective magnetic field and a fourth corrective magnetic-field in the same direction and opposite to said first corrective magnetic field by said third and fourth circular loop coils; thereby correcting second-order static magnetic field components in the static magnetic field direction.

In this specification, by a "second order" is meant a quadric function of a position in a static magnetic field direction. By a "zeroth order" is meant independence of the position in the static magnetic field direction. Furthermore, by a "first order" is meant a linear function of the static magnetic field direction.

In the second-order static magnetic field correcting method of the first aspect, since the direction of the first and second corrective magnetic fields generated by the first and second circular loop coils is opposite to the direction of the third and fourth corrective magnetic fields generated by the third and fourth circular loop coils, zeroth-order corrective magnetic field components in the static magnetic field direction can cancel one another, and thus the zeroth-order static magnetic field components are not affected. On the other hand, since the zeroth-order corrective magnetic field components are independent of the second-order corrective magnetic field components, the second-order corrective magnetic field components remain even after the zeroth-order corrective magnetic field components have canceled one another. Therefore, the second-order corrective magnetic field components can cancel the second-order, static magnetic field components, and homogeneity of the static magnetic field can be improved.

Since the first and second corrective magnetic fields are in the same direction, these fields will not generate first corrective magnetic field components. Similarly, since the third and fourth corrective magnetic fields are in the same direction, these fields will not generate first corrective magnetic field components.

In accordance with its second aspect, the present invention provides the second-order static magnetic field correcting method of the aforementioned configuration, characterized in that said first and second circular loop coils are disposed substantially coplanar with gradient coils for the static magnetic field direction and outside said gradient coils.

In the second-order static magnetic field correcting method of the second aspect, since the first and second circular loop coils are disposed substantially coplanar with gradient coils for the static magnetic field direction and outside the gradient coils, symmetry with respect to the gradient coils for the static magnetic field direction is conserved; moreover, the first and second corrective magnetic fields are in the same direction, and therefore the gradient magnetic fields are not substantially affected. Furthermore, since circular loop coils, which have no return path, exhibit better linearity than that of gradient coils having return paths, linearity of the gradient magnetic fields is not substantially affected.

In accordance with its third aspect, the present invention provides the second-order static magnetic field correcting method of the aforementioned configuration, characterized in that said third and fourth circular loop coils are disposed surrounding magnetism conditioning plates.

In the second-order static magnetic field correcting method of the third aspect, since the third and fourth circular loop coils are disposed surrounding magnetism conditioning plates, the space for installing the circular loop coils can be easily secured. Moreover, there is no need for concern about coupling with the gradient coils.

If the third and fourth circular loop coils are disposed so that the conditions of Helmholtz coils are fulfilled, second-order corrective magnetic field components generated by the third and fourth circular loop coils can be ignored. Therefore, in order to cancel second-order static magnetic field components, only the second-order corrective magnetic field components generated by the first and second circular loop coils need to be adjusted, and thus the adjustment can be done easily.

In accordance with its fourth aspect, the present invention provides the second-order static magnetic field correcting method of the aforementioned configuration, characterized in that at least one of the ratio of electric currents and the turns ratio of said first through fourth circular loop coils is determined so that zeroth-order corrective magnetic field components in the static magnetic field direction cancel one another.

In the second-order static magnetic field correcting method of the fourth aspect, since the ratio of electric currents or the turns ratio is adjusted so that the zeroth-order corrective magnetic field components are canceled out, only the electric current values need to be adjusted to cancel the second-order static magnetic field components while maintaining the ratio of corrective electric currents, and thus the adjustment can be done easily.

In accordance with its fifth aspect, the present invention provides a second-order static magnetic field correcting method, characterized in: disposing three RF probes at different positions in a static magnetic field direction of an MRI apparatus, each of which probes has a small phantom capable of emitting an FID (free induction decay) signal and a small coil combined; transmitting RF pulses from said RF probes and receiving FID signals at a time when a magnetic field variation is to be measured; determining frequencies f1, f2 and f3 from the FID signals; determining a second-order static magnetic field component, β2 by solving the following simultaneous equations:

$$f_1 = \beta_0 + \beta_1 \cdot r_1 + \beta_2 \cdot r_1^2$$

$$f_2 = \beta_0 + \beta_1 \cdot r_2 + \beta_2 \cdot r_2^2,$$

$$f_3 = \beta_0 + \beta_1 \cdot r_3 + \beta_2 \cdot r_3^2$$

wherein the positions of said RF probes are designated by r1, r2 and r3; and adjusting corrective magnetic fields based on said second-order static magnetic field component β2.

In the second-order static magnetic field correcting method of the fifth aspect, since corrective magnetic fields are adjusted by disposing RF probes to measure the second-order magnetic field components at an appropriate time, the correction can be suitably achieved.

In accordance with its sixth aspect, the present invention provides a second-order static magnetic field correcting method, characterized in: disposing three RF probes at different positions in a static magnetic field direction of an MRI apparatus, each of which probes has a small phantom capable of emitting an FID signal and a small coil combined; transmitting RF pulses from said RF probes and receiving FID signals at a time when a reference magnetic field is to be measured; determining reference frequencies f1r, f2r and f3r from the FID signals; transmitting RF pulses from said RF probes and receiving FID signals at a time when a magnetic field variation is to be measured; determining frequencies f1, f2 and f3 from the FID signals; determining a second-order magnetic field variation α2 by solving the following simultaneous equations:

$$f_1 - f_{1r} = \alpha_0 + \alpha_1 \cdot r_1 + \alpha_2 \cdot r_1^2$$

$$f_2 - f_{2r} = \alpha_0 + \alpha_1 \cdot r_2 + \alpha_2 \cdot r_2^2$$

$$f_3 - f_{3r} = \alpha_0 + \alpha_1 \cdot r_3 + \alpha_2 \cdot r_3^2$$

wherein the positions of said RF probes are designated by r1, r2 and r3; and adjusting corrective magnetic fields based on said second-order magnetic field variation α2.

In the second-order static magnetic field correcting method of the sixth aspect, since corrective magnetic fields are adjusted by disposing RF probes to measure a reference static magnetic field as a reference frequency at an appropriate time, disposing the RF probes to measure the static magnetic field as a frequency at a later appropriate time, and measuring a second-order magnetic field variation from their difference, the correction can be suitably achieved.

In accordance with its seventh aspect, the present invention provides the second-order static magnetic field correcting method of the aforementioned configuration, characterized in: determining a zeroth-order magnetic field variation α0, and adjusting a transmit frequency for an RF pulse and a receive detection frequency for an NMR signal based on said zeroth-order magnetic field variation α0.

In the second-order static magnetic field correcting method of the seventh aspect, a zeroth-order static magnetic field variation can be compensated by correction of the transmit frequency for an RF pulse and the receive detection frequency for an NMR signal.

In accordance with its eighth aspect, the present invention provides the second-order static magnetic field correcting method of the aforementioned configuration, characterized in: determining a first-order magnetic field variation α1, and adjusting a gradient electric current based on said first-order magnetic field variation α1.

In the second-order static magnetic field correcting method of the eighth aspect, a first-order static magnetic field variation can be compensated by correction of the gradient electric current.

In accordance with its ninth aspect, the present invention provides the second-order static magnetic field correcting method of the aforementioned configuration, characterized in that said MRI apparatus is an open-type MRI apparatus that generates the static magnetic field in a vertical direction.

In the second-order static magnetic field correcting method of the ninth aspect, homogeneity of the static magnetic field in an open-type MRI apparatus in which homogeneity of the magnetic field is obtained by mechanical shimming or by adding small pieces of magnet, iron or the like can be improved.

In accordance with its tenth aspect, the present invention provides an MRI apparatus characterized in comprising: a first circular loop coil and a second circular loop coil disposed at positions spaced in a static magnetic field direction to be symmetrical with respect to a center of an imaging region, for generating a first corrective magnetic field and a second corrective magnetic field in the same direction; a third circular loop coil and a fourth circular loop coil having a larger diameter than that of said first and second circular loop coils, disposed at positions spaced in the static magnetic field direction to be symmetrical with respect to the center of said imaging region, for generating a third corrective magnetic field and a fourth corrective magnetic field in the same direction and opposite to said first corrective magnetic field; and circular loop coil driving means for applying corrective electric currents to said first through fourth circular loop coils to generate said first through fourth corrective magnetic fields.

In the MRI apparatus of the tenth aspect, the second-order static magnetic field correcting method as described regarding the first aspect can be suitably implemented.

In accordance with its eleventh aspect, the present invention provides the MRI apparatus of the aforementioned configuration, characterized in that said first and second circular loop coils are disposed substantially coplanar with gradient coils for the static magnetic field direction and outside said gradient coils.

In the MRI apparatus of the eleventh aspect, the second-order static magnetic field correcting method as described regarding the second aspect can be suitably implemented.

In accordance with its twelfth aspect, the present invention provides the MRI apparatus of the aforementioned configuration, characterized in that said third and fourth circular loop coils are disposed surrounding magnetism conditioning plates.

In the MRI apparatus of the twelfth aspect, the second-order static magnetic field correcting method as described regarding the third aspect can be suitably implemented.

In accordance with its thirteenth aspect, the present invention provides the MRI apparatus of the aforementioned configuration, characterized in that at least one of the ratio of electric currents and the turns ratio of said first through fourth circular loop coils is determined so that zeroth-order corrective magnetic field components in the static magnetic field direction cancel one another.

In the MRI apparatus of the thirteenth aspect, the second-order static magnetic field correcting method as described regarding the fourth aspect can be suitably implemented.

In accordance with its fourteenth aspect, the present invention provides the MRI apparatus of the aforementioned configuration, characterized in comprising: frequency acquiring means for, under the condition that three RF probes are disposed at different positions in the static magnetic field direction, each of which probes has a small phantom capable of emitting an FID signal and a small coil combined, transmitting RF pulses from said RF probes and receiving FID signals, and determining frequencies f1, f2 and f3 from the FID signals; and corrective magnetic field adjusting means for determining a second-order static magnetic field component β2 by solving the following simultaneous equations:

$$f_1 = \beta_0 + \beta_1 \cdot r_1 + \beta_2 \cdot r_1^2$$

$$f_2 = \beta_0 + \beta_1 \cdot r_2 + \beta_2 \cdot r_2^2$$

$$f_3 = \beta_0 + \beta_1 \cdot r_3 + \beta_2 \cdot r_3^2$$

wherein the positions of said RF probes are designated by r1, r2 and r3, and adjusting the corrective magnetic fields based on said second-order static magnetic field component β2.

In the MRI apparatus of the fourteenth aspect, the second-order static magnetic field correcting method as described regarding the fifth aspect can be suitably implemented.

In accordance with its fifteenth aspect, the present invention provides the MRI apparatus of the aforementioned configuration, characterized in comprising: reference frequency acquiring means for, under the condition that three RF probes are disposed at different positions in the static magnetic field direction, each of which probes has a small phantom capable of emitting an FID signal and a small coil combined, transmitting RF pulses from said RF probes and receiving FID signals at a time when a reference magnetic field is to be measured, and determining reference frequencies f1r, f2r and f3r from the FID signals; frequency acquiring means for, under the condition that three RF probes are disposed at different positions in the static magnetic field direction, each of which probes has a small phantom capable of emitting an FID signal and a small coil combined, transmitting RF pulses from said RF probes and receiving FID signals at a time when a magnetic field variation is to be measured, and determining frequencies f1, f2 and f3 from the FID signals; and second-order magnetic field variation compensating means for determining a second-order magnetic field variation α2 by solving the following simultaneous equations:

$$f_1 - f_{1r} = \alpha_0 + \alpha_1 \cdot r_1 + \alpha_2 \cdot r_1^2$$

$$f_2 - f_{2r} = \alpha_0 + \alpha_1 \cdot r_2 + \alpha_2 \cdot r_2^2$$

$$f_3 - f_{3r} = \alpha_0 + \alpha_1 \cdot r_3 + \alpha_2 \cdot r_3^2$$

wherein the positions of said RF probes are designated by r1, r2 and r3, and adjusting the corrective magnetic fields based on said second-order magnetic field variation α2.

In the MRI apparatus of the fifteenth aspect, the second-order static magnetic field correcting method as described regarding the sixth aspect can be suitably implemented.

In accordance with its sixteenth aspect, the present invention provides the MRI apparatus of the aforementioned configuration, characterized in comprising zeroth-order magnetic field variation compensating means for determining a zeroth-order magnetic field variation α0, and adjusting a transmit frequency for an RF pulse and a receive detection frequency for an NMR signal based on said zeroth-order magnetic field variation α0.

In the MRI apparatus of the sixteenth aspect, the second-order static magnetic field correcting method as described regarding the seventh aspect can be suitably implemented.

In accordance with its seventeenth aspect, the present invention provides the MRI apparatus of the aforementioned configuration, characterized in comprising first-order magnetic field variation compensating means for determining a first-order magnetic field variation α1, and adjusting a gradient electric current based on said first-order magnetic field variation α1.

In the MRI apparatus of the seventeenth aspect, the second-order static magnetic field correcting method as described regarding the eighth aspect can be suitably implemented.

In accordance with its eighteenth aspect, the present invention provides the MRI apparatus of the aforementioned configuration, characterized in that said MRI apparatus is an open-type MRI apparatus that generates the static magnetic field in a vertical direction.

In the MRI apparatus of the eighteenth aspect, the second-order static magnetic field correcting method as described regarding the ninth aspect can be suitably implemented.

According to the second-order static magnetic field correcting method and the MRI apparatus of the present invention, second-order static magnetic field components can be reduced to improve homogeneity of the static magnetic field in an MRI apparatus.

Further objects and advantages of the present invention will be apparent from the following description of the preferred embodiments of the invention as illustrated in the accompanying drawings.

DETAILED DESCRIPTION OF THE INVENTION

The present invention will now be described in more detail with reference to embodiments of the present invention shown in the accompanying drawings.

Figure 1:
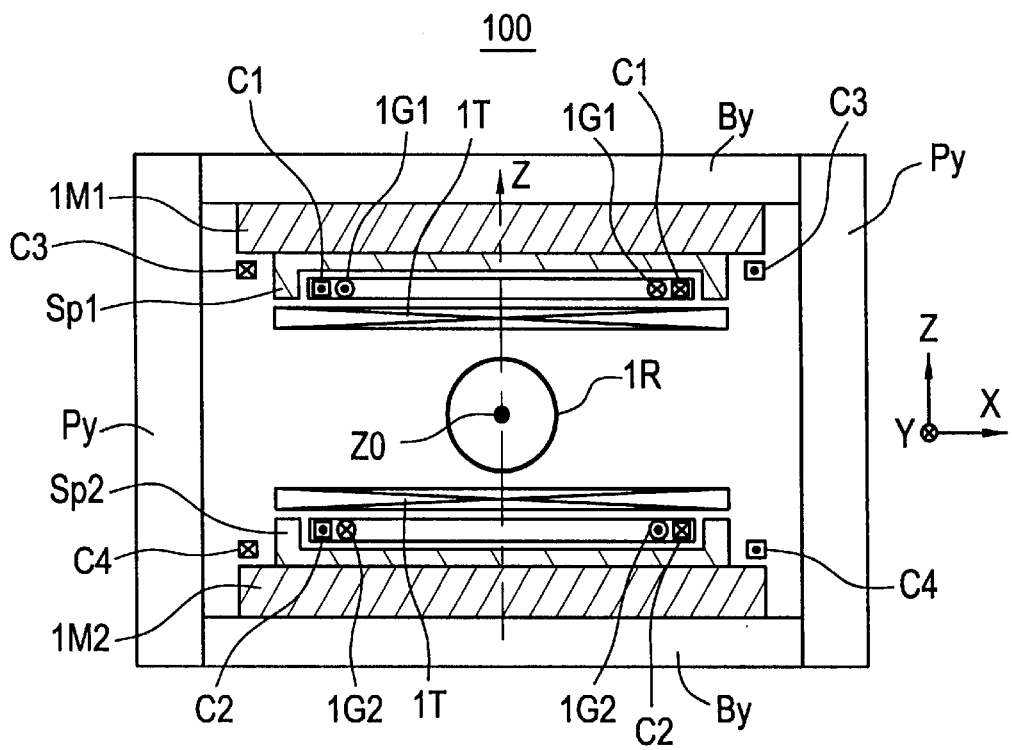
FIG. 1 is a main portion cross-sectional view illustrating an MRI apparatus in accordance with one embodiment of the present invention.

FIG. 1 is a major portion cross-sectional view illustrating an MRI apparatus 100 in accordance with one embodiment of the present invention.

The MRI apparatus 100 is an open-type MRI apparatus that generates the static magnetic field in the vertical direction by permanent magnets 1M1 and 1M2 disposed above and below and facing each other.

On the surfaces of the permanent magnets 1M1 and 1M2 are disposed respective magnetism conditioning plates Sp1 and Sp2 for creating an imaging region having a homogeneous static magnetic field inside a receiving coil 1R capable of containing therein a subject.

The permanent magnets 1M1 and 1M2, magnetism conditioning plates Sp1 and Sp2, base yokes By and pole yokes Py constitute a magnetic circuit.

It should be noted that superconductive magnets may be employed instead of the permanent magnets 1M1 and 1M2.

On the surfaces of the magnetism conditioning plates Sp1 and Sp2 are disposed respective gradient coils 1G1 and 1G2 for generating gradient magnetic fields in the static magnetic field.

Inside the gradient coils 1G1 and 1G2, transmitting coils 1T are disposed for transmitting RF pulses for exciting spins of atomic nuclei within the subject.

The receiving coil 1R is a coil for receiving NMR signals emanating from the subject.

A first circular loop coil C1 is disposed on the same substrate as that for the gradient coil 1G1, and outside the gradient coil 1G1.

A second circular loop coil C2 is disposed on the same substrate as that for the gradient coil 1G2, and outside the gradient coil 1G2.

The first and second circular loop coils C1 and C2 have the same diameter, and are disposed at positions spaced in the static magnetic field direction to be symmetrical with respect to a center Z0 of the imaging region.

A third circular loop coil C3 is disposed surrounding the magnetism conditioning plate Sp1.

A fourth circular loop coil C4 is disposed surrounding the magnetism conditioning plate Sp2.

The third and fourth circular loop coils C3 and C4 have the same diameter, and are disposed at positions spaced in the static magnetic field direction to be symmetrical with respect to the center Z0 of the imaging region to fulfill the conditions of Helmholtz coils.

Figure 2:
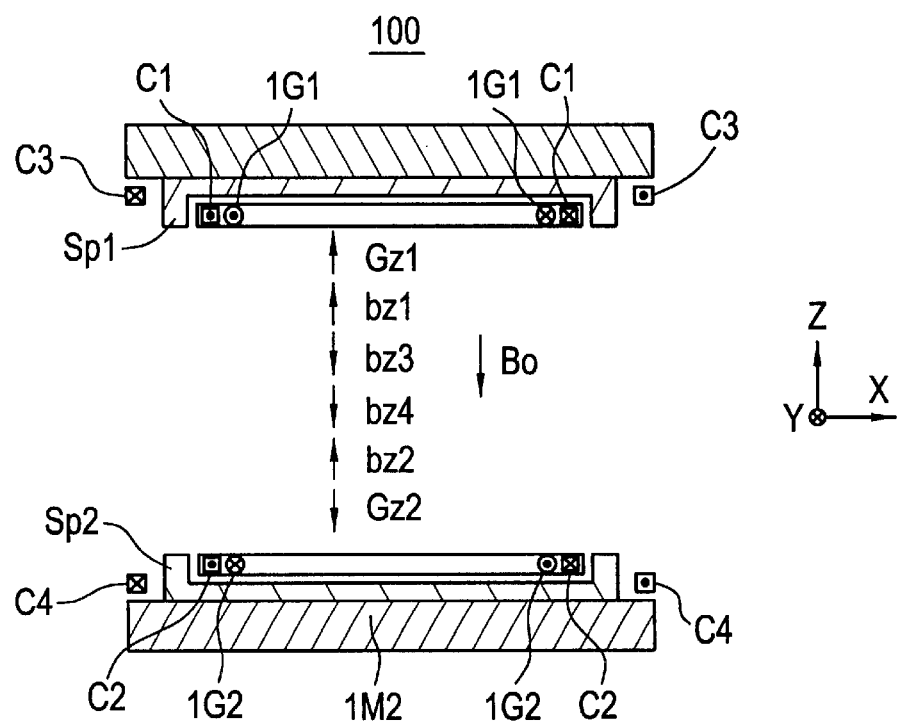
FIG. 2 is a view for explanation illustrating magnetic fields in the static magnetic field direction.

As shown in FIG. 2, the gradient coil 1G1 generates a gradient magnetic field Gz1. The gradient coil 1G2 generates a gradient magnetic field Gz2 in a direction opposite to the gradient magnetic field Gz1. Thus, a gradient magnetic field is generated in the static magnetic field direction.

The first circular loop coil C1 generates a first corrective magnetic field bz1. The second circular loop coil C2 generates a second corrective magnetic field bz2 in the same direction as the first corrective magnetic field bz1.

The third circular loop coil C3 generates a third corrective magnetic field bz3 in a direction opposite to the first corrective magnetic field bz1. The fourth circular loop coil C4 generates a fourth corrective magnetic field bz4 in the same direction as the third corrective magnetic field bz3.

Figure 3:
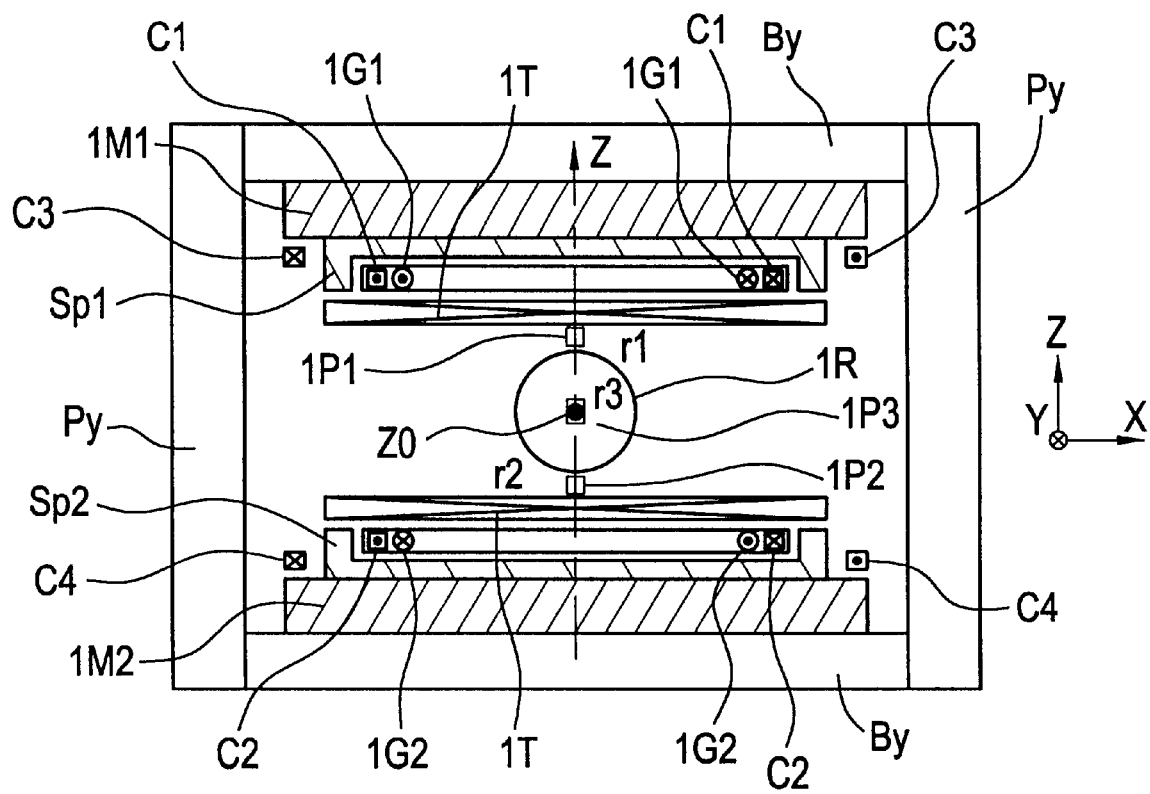
FIG. 3 is a main portion cross-sectional view showing the condition in measuring the static magnetic field of an MRI apparatus in accordance with one embodiment of the present invention.

FIG. 3 is a main portion cross-sectional view illustrating the condition in which three RF probes 1P1, 1P2 and 1P3 for measuring the magnetic field are disposed at three positions on an axis Z in the static magnetic field direction passing through the center Z0 of the imaging region.

In this specification, the disposed positions of the RF probes 1P1, 1P2 and 1P3 are designated by r1, r2 and r3.

Figure 4:
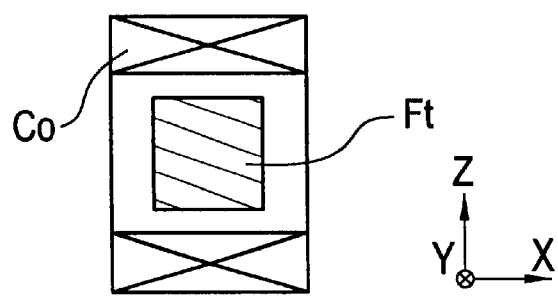
FIG. 4 is a cross-sectional view illustrating one example of an RF probe in accordance with the present invention.

FIG. 4 is an explanatory cross-sectional view illustrating the RF probes 1P1, 1P2 and 1P3.

The RF probes 1P1, 1P2 and 1P3 each has a configuration in which a small phantom Ft enclosing NaCl solution or $CuSO_4$ solution capable of emitting an FID signal, and a small coil Co surrounding the small phantom Ft are combined.

Figure 5:
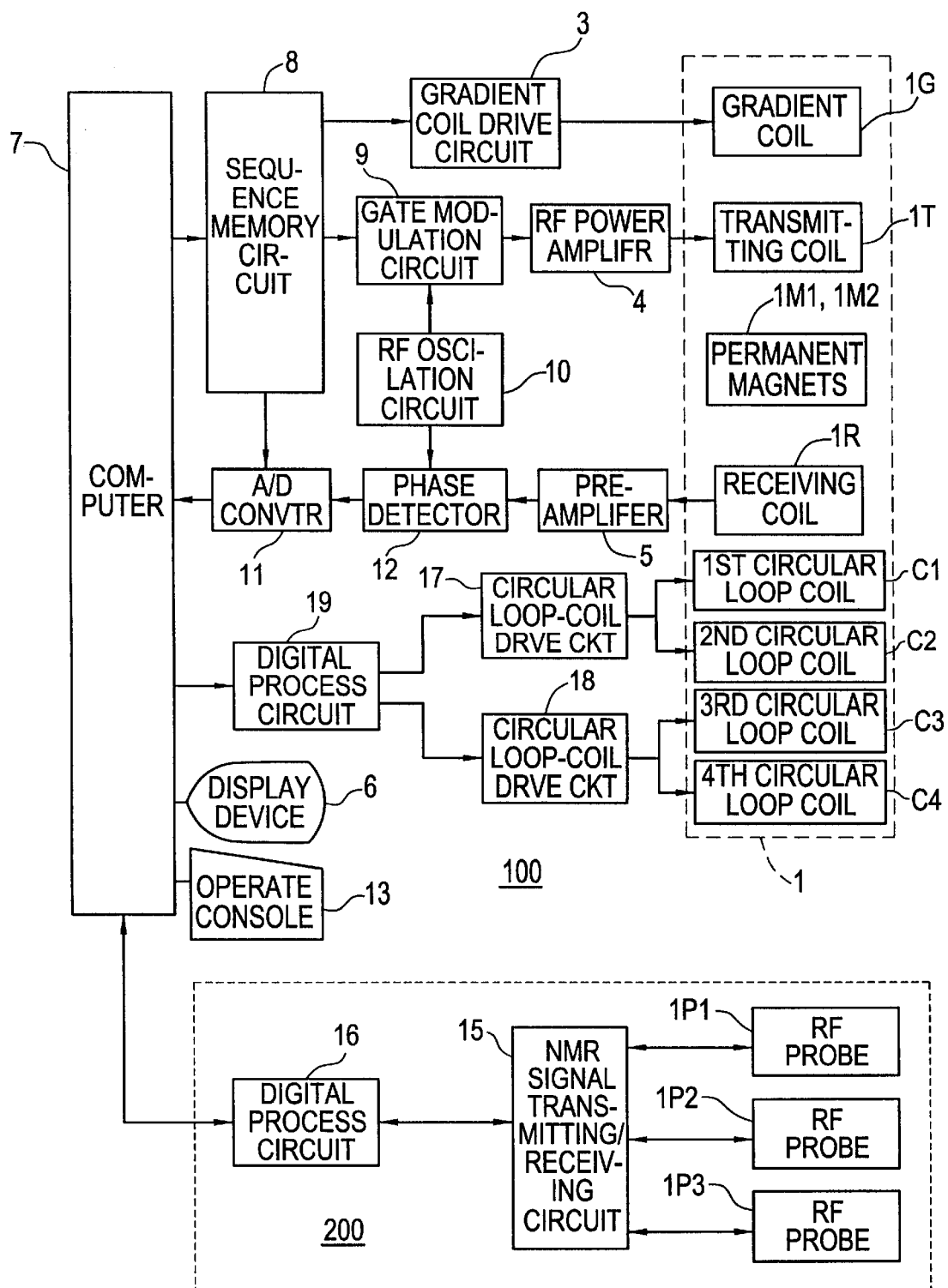
FIG. 5 is a configuration block diagram showing an MRI apparatus in accordance with one embodiment of the present invention.

FIG. 5 is a configuration block diagram showing the MRI apparatus 100.

In the MRI apparatus 100, a magnet assembly 1 is configured to comprise the permanent magnets 1M1 and 1M2, receiving coil 1R, gradient coil 1G, (the gradient coil 1G consists of X-axis gradient coils, Y-axis gradient coils and Z-axis gradient coils 1G1 and 1G2), transmitting coils 1T, and circular loop coils C1–C4.

The receiving coil 1R is connected to a preamplifier 5.

The gradient coil 1G is connected to a gradient coil driving circuit 3.

The transmitting coils 1T are connected to an RF power amplifier 4.

A sequence memory circuit 8 operates the gradient coil driving circuit 3 based on an imaging pulse sequence, such as one according to a spin echo technique, in response to instructions from a computer 7 to thereby generate an X-axis gradient magnetic field, Y-axis gradient magnetic field and Z-axis gradient magnetic field by the gradient coil 1G. The sequence memory circuit 8 also operates a gate modulation circuit 9 to modulate a high-frequency output signal from an RF oscillation circuit 10 into a pulsed signal of predefined timing and envelope shape. The pulsed signal is applied to the RF power amplifier 4 as an RF pulse signal, power-amplified in the RF power amplifier 4, and then applied to the transmitting coils 1T in the magnet assembly 1 to transmit the RF pulse from the transmitting coils 1T.

The preamplifier 5 amplifies an NMR signal from the subject detected at the receiving coil 1R, and inputs the signal to a phase detector 12. The phase detector 12 phase-detects the NMR signal from the preamplifier 5 employing the output from the RF oscillation circuit 10 as a receive detection signal, and supplies the phase-detected signal to an A/D converter 11. The A/D converter 11 converts the phase-detected analog signal into digital signal MR data, and inputs it to the computer 7.

The computer 7 performs an image reconstruction operation on the MR data to produce an MR image. The MR image is displayed on a display device 6. The computer 7 is also responsible for overall control such as receiving information input from an operating console 13.

Moreover, the computer 7 controls circular loop coil driving circuits 17 and 18 via a digital processing circuit 19 to apply corrective electric currents to the circular loop coils C1–C4 for generating the corrective magnetic fields bz1–bz4, thereby correcting second-order static magnetic field components to improve homogeneity of the static magnetic field.

In measuring the magnetic field, the RF probes 1P1, 1P2 and 1P3 are placed and connected to the computer 7 via an NMR signal transmitting/receiving circuit 15 and a digital processing circuit 16.

The RF probes 1P1, 1P2 and 1P3, NMR signal transmitting/receiving circuit 15 and digital processing circuit 16 constitute a static magnetic field measuring auxiliary apparatus 200.

When the static magnetic field measuring auxiliary apparatus 200 is connected, the computer 7 executes second-order static magnetic field measuring processing, reference magnetic field measuring processing or magnetic field compensating processing. The second-order static magnetic field measuring processing will be elaborated later with reference to FIGS. 7 and 8. The reference magnetic field measuring processing will be elaborated later with reference to FIG. 9. The magnetic field compensating processing will be elaborated later with reference to FIG. 10.

Figure 6:
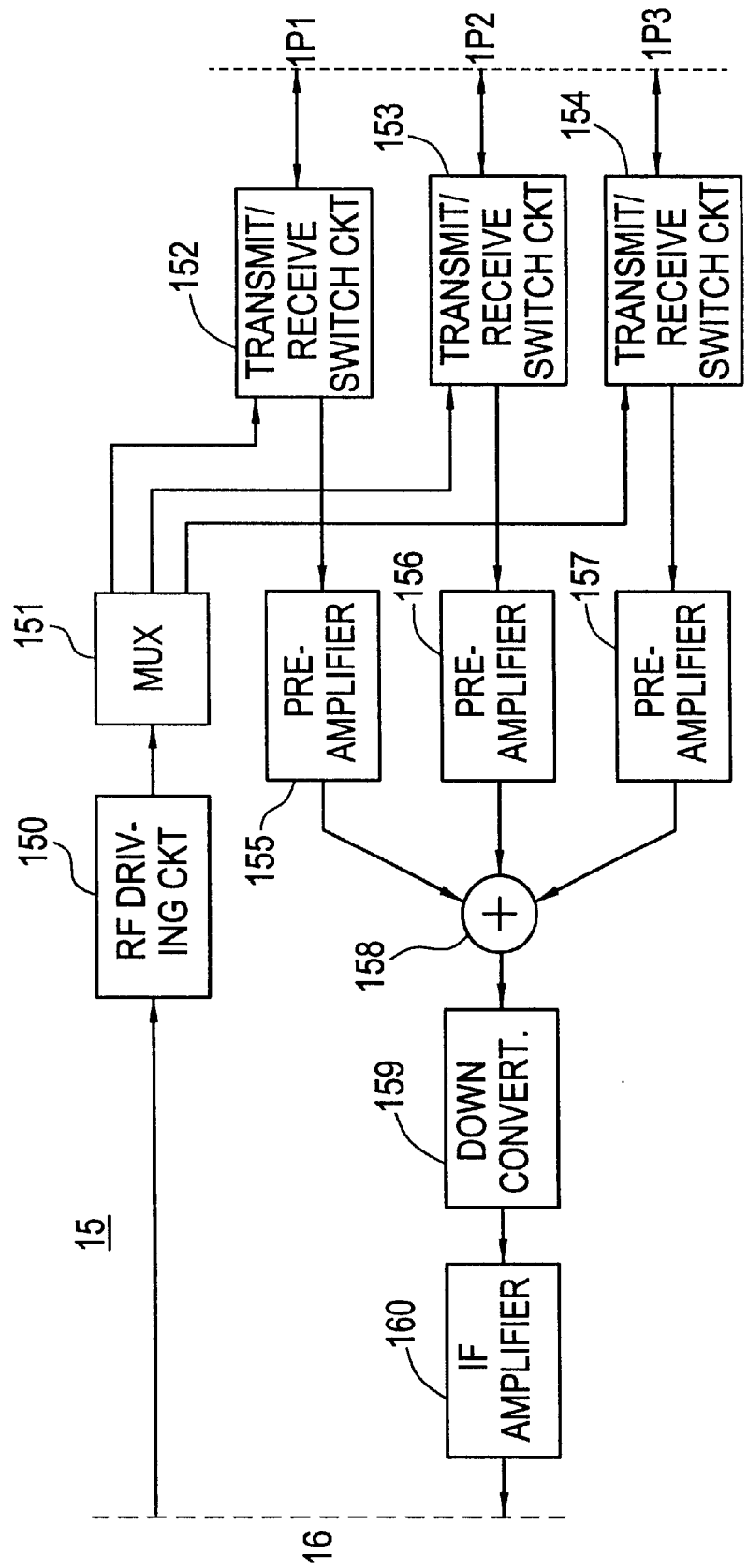
FIG. 6 is a block diagram showing one example of an NMR signal transmitting/receiving circuit in accordance with the present invention.

FIG. 6 is a configuration block diagram of the NMR signal transmitting/receiving circuit 15.

The NMR signal transmitting/receiving circuit 15 comprises an RF driving circuit 150 that comprises an RF oscillation circuit, gate modulation circuit and RF power amplifier; a multiplexer 151 for switching the output destination of RF pulse transmitted signals output from the RF driving circuit 150; transmission/reception switching switches 152, 153 and 154 for switching between transmission of the RF pulse transmitted signals to the RF probes 1P1, 1P2 and 1P3 and reception of FID received signals from the RF probes 1P1, 1P2 and 1P3; preamplifiers 155, 156 and 157 for amplifying the FID received signals from the RF probes 1P1, 1P2 and 1P3; an adder 158 for adding the FID received signals amplified at the preamplifiers 155, 156 and 157; a down converter 159 for converting the frequency of the FID received signals to the intermediate frequency band; and an intermediate frequency amplifier 160 for amplifying the FID signals frequency-converted to the intermediate frequency band.

The digital processing circuit 16 operates the NMR signal transmitting/receiving circuit 15 in response to instructions from the computer 7, and converts the FID signals into digital data and inputs them to the computer 7.

Figure 7:
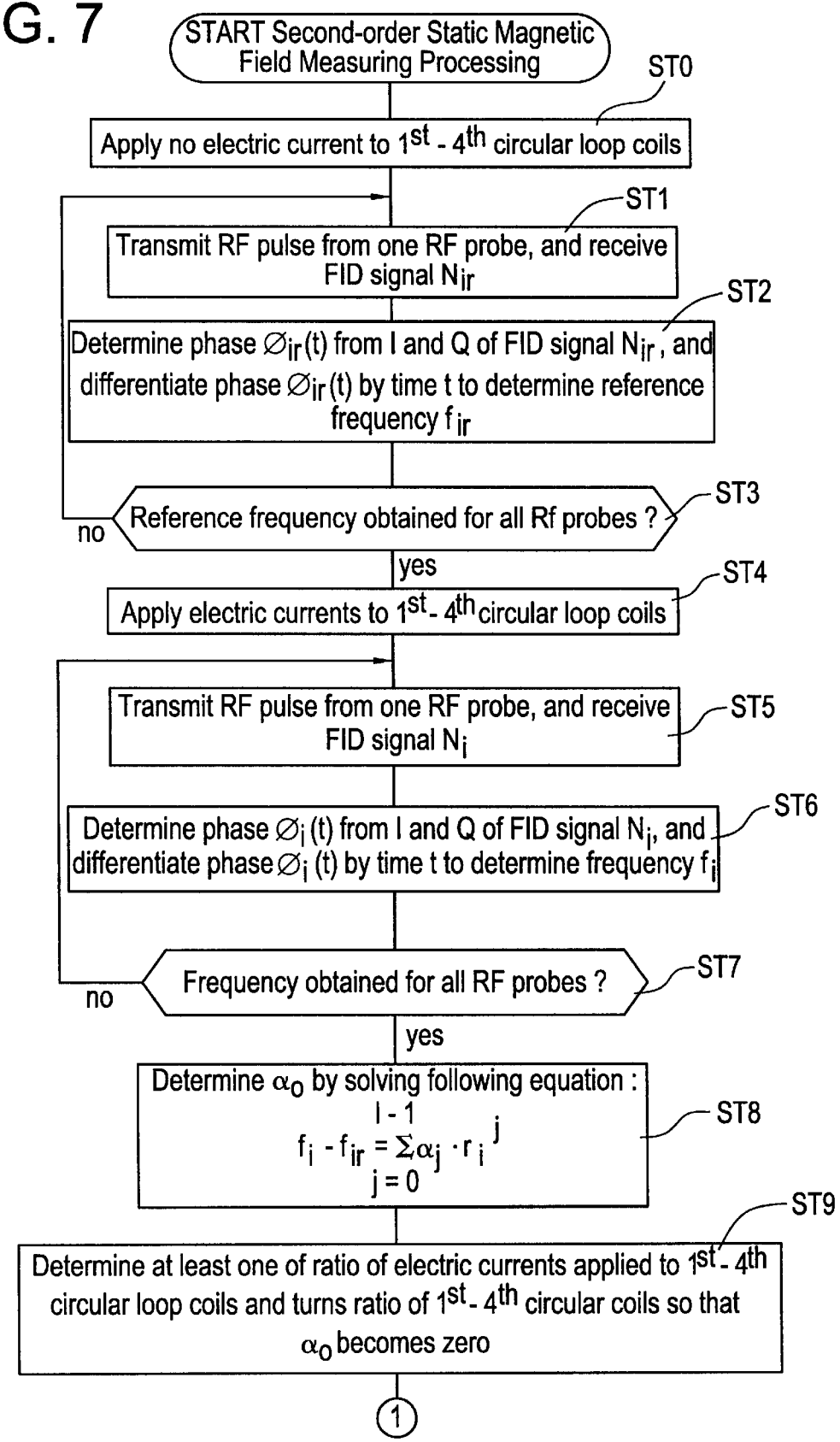
FIG. 7 is a flow chart showing the operation of second-order static magnetic field measuring processing in accordance with the present invention.

FIG. 7 is a flow chart showing the operation of the second-order static magnetic field measuring processing by the MRI apparatus 100. The second-order static magnetic field measuring processing is activated by instructions from an operator under the condition in which the static magnetic field measuring auxiliary apparatus 200 is connected and the three RF probes 1P1, 1P2 and 1P3 are disposed.

In Step ST0, no electric current is applied to the circular loop coils C1–C4.

In Step ST1, an RF pulse is transmitted from one RF probe and an FID signal $N_{ir}$ is obtained. For example, an RF pulse is transmitted from the first RF probe 1P1 and an FID signal $N_{1r}$ is received.

In Step ST2, a phase $\phi_{ir}(t)$ is determined from I and Q of the FID signal $N_{ir}$, and the phase $\phi_{ir}(t)$ is differentiated by the time t to determine a reference frequency $f_{ir}$. For example, a reference frequency $f_{1r}$ is determined from the FID signal $N_{1r}$.

In Step ST3, if the reference frequency has not been obtained for all the RF probes, the process goes back to Step ST1; otherwise goes to Step ST4. Specifically, if only the reference frequency $f_{1r}$ at the first RF probe 1P1 has been obtained, the process goes back to Step ST1 to obtain a reference frequency $f_{2r}$ at the second RF probe 1P2 in Steps ST1 and ST2. Moreover, if only the reference frequency $f_{1r}$ at the first RF probe 1P1 and the reference frequency $f_{2r}$ at the second RF probe 1P2 have been obtained, the process goes back to Step ST1 to obtain a reference frequency $f_{3r}$ at the second RF probe 1P3 in Steps ST1 and ST2. The process then goes to Step ST4.

In Step ST4, electric currents having the same magnitude are applied to the circular loop coils C1–C4.

In Step ST5, an RF pulse is transmitted from one RF probe and an FID signal $N_i$ is obtained. For example, an RF pulse is transmitted from the first RF probe 1P1 and an FID signal $N_1$ is received.

In Step ST6, a phase $\phi_i(t)$ is determined from I and Q of the FID signal $N_i$, and the phase $\phi_i(t)$ is differentiated by the time t to determine a frequency $f_i$. For example, a frequency $f_1$ is determined from the FID signal $N_1$.

In Step ST7, if the frequency has not been obtained for all the RF probes, the process goes back to Step ST5; otherwise goes to Step ST8. Specifically, if only the frequency $f_1$ at the first RF probe 1P1 has been obtained, the process goes back to Step ST5 to obtain a frequency $f_2$ at the second RF probe 1P2 in Steps ST5 and ST6. Moreover, if only the frequency $f_1$ at the first RF probe 1P1 and the frequency $f_2$ at the second RF probe 1P2 have been obtained, the process goes back to Step ST5 to obtain a frequency $f_3$ at the third RF probe 1P3 in Steps ST5 and ST6. The process then goes to Step ST8.

In Step ST8, a zeroth-order variation component $\alpha_0$ (i.e., a zeroth-order static magnetic field component generated by applying the electric currents to the circular loop coils C1–C4) is determined by solving the following simultaneous equations:

$$f_1 - f_{1r} = \alpha_0 + \alpha_1 \cdot r_1 + \alpha_2 \cdot r_1^2$$

$$f_2 - f_{2r} = \alpha_0 + \alpha_1 \cdot r_2 + \alpha_2 \cdot r_2^2$$

$$f_3 - f_{3r} = \alpha_0 + \alpha_1 \cdot r_3 + \alpha_2 \cdot r_3^2$$

wherein the positions of the RF probes 1P1, 1P2 and 1P3 are designated by r1, r2 and r3.

In Step ST9, at least one of the ratio of electric currents applied to the circular loop coils C1–C4 and the turns ratio of the circular loop coils C1–C4 is determined so that the zeroth-order variation component $\alpha_0$ becomes zero. For example, the numbers of turns of the circular loop coils C1–C4 are made equal, the electric current values applied to the circular loop coils C1 and C2 are made equal, the electric current values applied to the circular loop coils C3 and C4 are made equal, and the electric current ratio between the electric current value applied to the circular loop coils C1 and C2 and the electric current value applied to the circular loop coils C3 and C4 is determined. Alternatively, the electric current values applied to the circular loop coils C1–C4 are made equal, the numbers of turns of the circular loop coils C1 and C2 are made equal, the numbers of turns of the circular loop coils C3 and C4 are made equal, and the turns ratio between the number of turns for the circular loop coils C1 and C2 and the number of turns for the circular loop coils C3 and C4 is determined. If the turns ratio is to be changed, the circular loop coils C1–C4 should be replaced.

Figure 8:
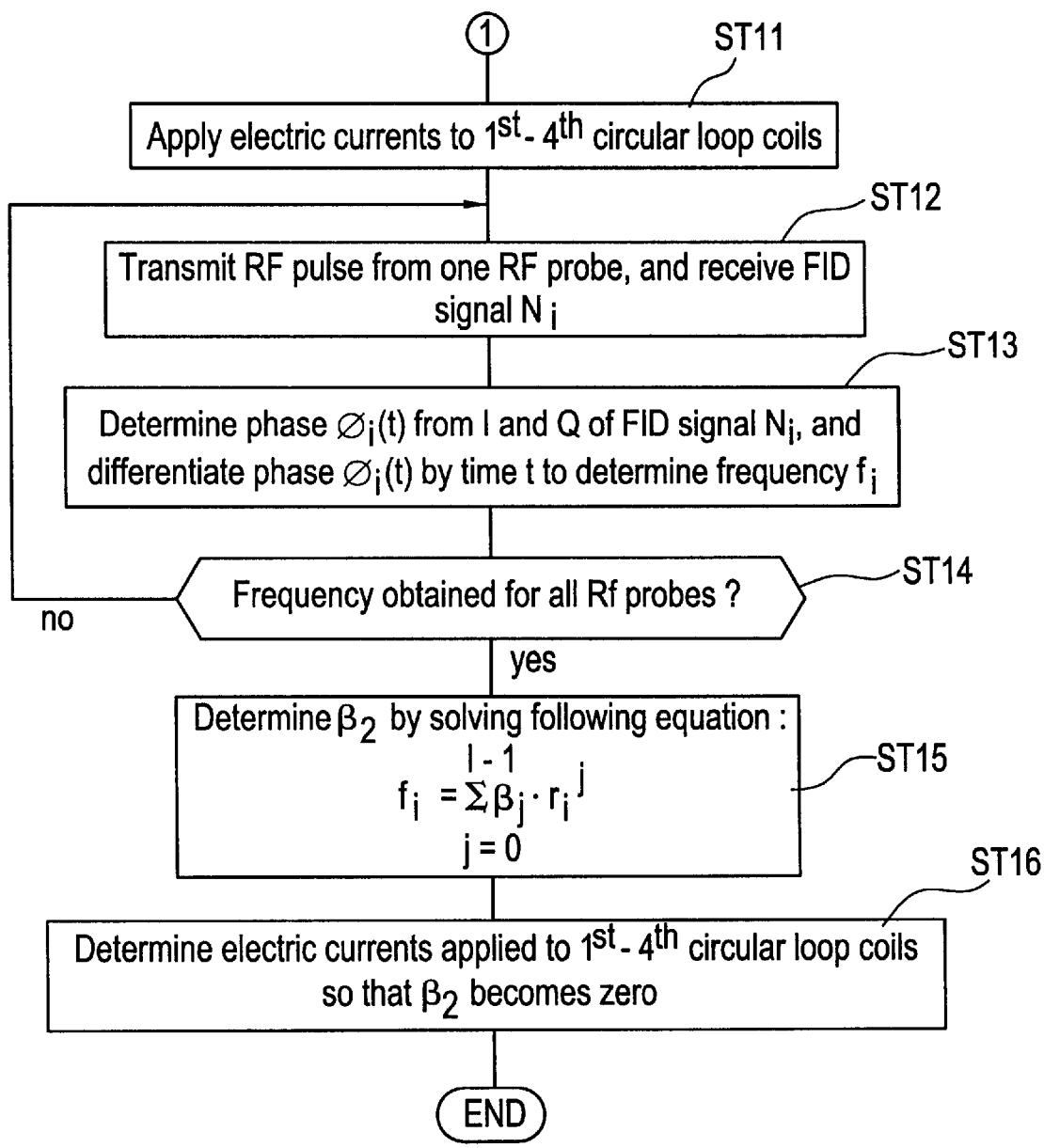
FIG. 8 is a flow chart continued from FIG. 7.

In Step ST11 in FIG. 8, the electric current ratio and the turns ratio determined in Step ST9 are used to apply appropriate electric currents to the circular loop coils C1–C4.

In Steps ST12–ST14, which are the same as Steps ST5–ST7, the frequencies f1, f2 and f3 are determined.

In Step ST15, a second-order static magnetic field component $\beta_2$ (i.e., a second-order component of the sum of the static magnetic field B0 and the corrective magnetic fields bz1–bz4 by the circular loop coils C1–C4) is determined by solving the following simultaneous equations:

$$f_1 = \beta_0 + \beta_1 \cdot r_1 + \beta_2 \cdot r_1^2$$

$$f_2 = \beta_0 + \beta_1 \cdot r_2 + \beta_2 \cdot r_2^2$$

$$f_3 = \beta_0 + \beta_1 \cdot r_3 + \beta_2 \cdot r_3^2$$

In Step ST16, the values of electric currents to be applied to the circular loop coils C1–C4 are determined so that the second-order static magnetic field component $\beta_2$ becomes zero. However, the electric current ratio should not be varied.

Thus, correction can be made so that the second-order static magnetic field components are reduced by applying electric currents having the electric current values determined in Step ST16 to the circular loop coils C1–C4, and homogeneity of the static magnetic field can be improved.

Figure 9:
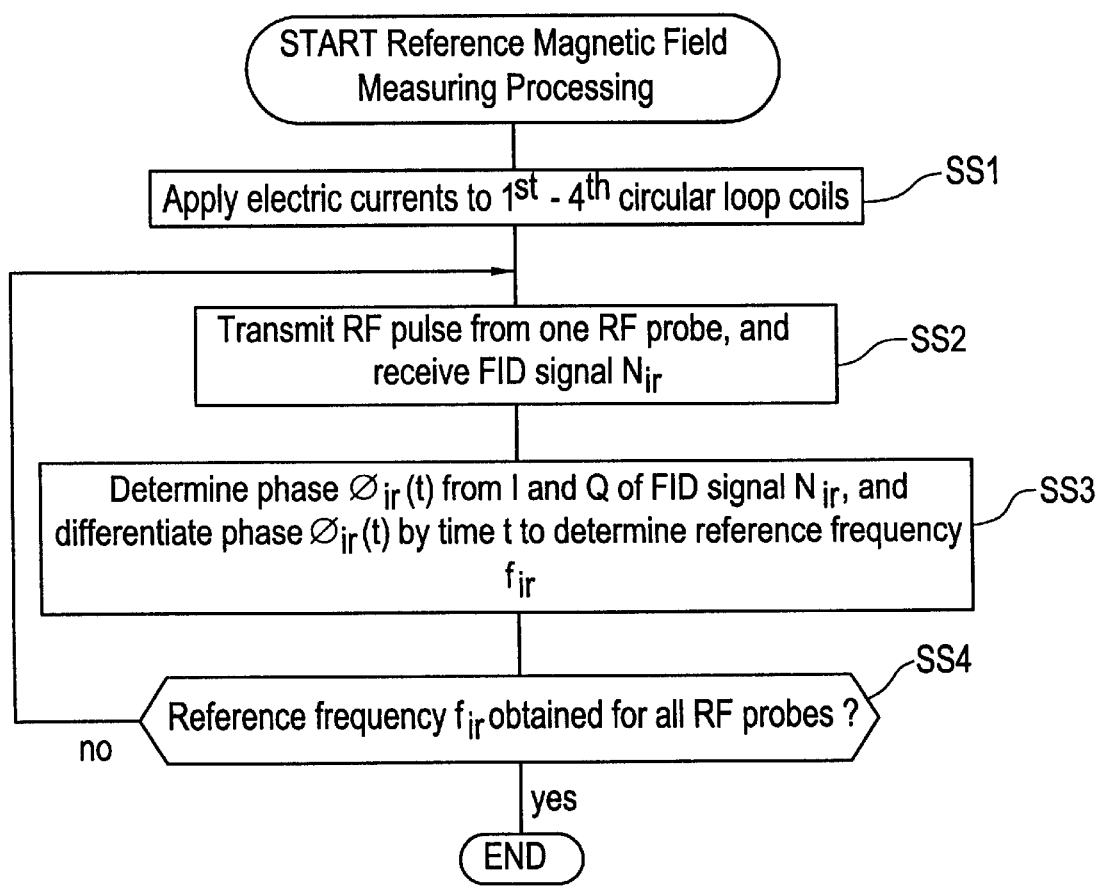
FIG. 9 is a flow chart showing the operation of reference magnetic field measuring processing in accordance with the present invention.

FIG. 9 is a flow chart showing the operation of the reference frequency measuring processing by the MRI apparatus 100. The reference frequency measuring processing is activated by instructions from the operator when the static magnetic field B0 is in a desirable state, and under the condition that the static magnetic field measuring auxiliary apparatus 200 is connected and the three RF probes 1P1, 1P2 and 1P3 are disposed.

In Step SS1, electric currents having the electric current values determined in Step ST16 described earlier or in Step SC7 which will be described later are applied to the circular loop coils C1–C4.

In Steps SS2–SS4, which are the same as Steps ST1–ST3, the reference frequencies $f_{1r}$, $f_{2r}$ and $f_{3r}$ are determined and stored.

Figure 10:
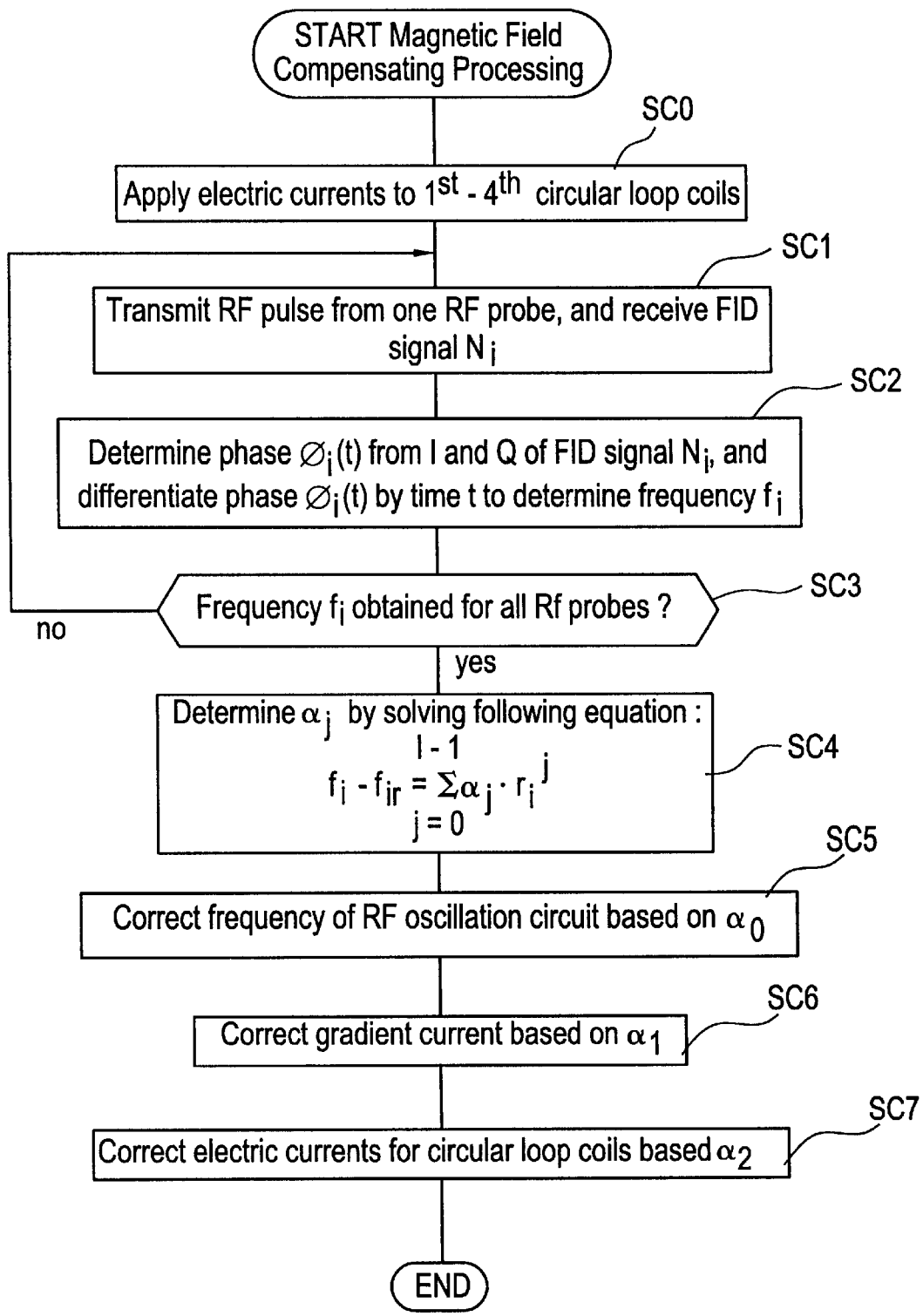
FIG. 10 is a flow chart showing the operation of magnetic field compensating processing in accordance with the present invention.

FIG. 10 is a flow chart showing the operation of the magnetic field compensating processing by the MRI apparatus 100. The magnetic field compensating processing is activated by instructions from the operator under the condition in which the static magnetic field measuring auxiliary apparatus 200 is connected and the three RF probes 1P1, 1P2 and 1P3 are disposed.

In Step SC0, electric currents having the electric current values determined in Step ST16 described earlier or in Step SC7 which will be described later are applied to the circular loop coils C1–C4.

In Steps SC1–SC3, which are the same as Steps ST5–ST7, the frequencies $f_1$, $f_2$ and $f_3$ are determined.

In Step SC4, a zeroth-order static magnetic field variation component $\alpha_0$, first-order static magnetic field variation component $\alpha_1$ and second-order static magnetic field variation component $\alpha_2$ are determined by solving the following simultaneous equations:

$$f_1 - f_{1r} = \alpha_0 + \alpha_1 \cdot r_1 + \alpha_2 \cdot r_1^2$$

$$f_2 - f_{2r} = \alpha_0 + \alpha_1 \cdot r_2 + \alpha_2 \cdot r_2^2$$

$$f_3 - f_{3r} = \alpha_0 + \alpha_1 \cdot r_3 + \alpha_2 \cdot r_3^2$$

In Step SC5, the oscillation frequency of the RF oscillation circuit 10 is corrected based on the zeroth-order static magnetic field variation $\alpha_0$.

In Step SC6, the gradient electric currents for the gradient coils 1G1 and 1G2 are corrected based on the first-order static magnetic field variation component $\alpha_1$. For example, offset electric currents are applied to the Z-axis gradient coils 1G1 and 1G2. A gradient magnetic field $\Delta G$ to be corrected is:

$$\Delta G = \frac{\alpha_1}{2r \cdot \gamma},$$

wherein the gyromagnetic ratio is represented as $\gamma$.

In Step SC7, the values of electric currents to be applied to the circular loop coils C1–C4 are determined so that the second-order static magnetic field variation component $\alpha_2$ is reduced. However, the electric current ratio should not be varied.

By Steps SC5–SC7, a variation in the static magnetic field caused by a metal mass (e.g., an automobile) moving near the MRI apparatus 100 or an environment change (e.g., a change in temperature) etc. can be restrained.

Many widely different embodiments of the invention may be configured without departing from the spirit and the scope of the present invention. It should be understood that the present invention is not limited to the specific embodiments described in the specification, except as defined in the appended claims.

What is claimed is:

1. A second order static magnetic field correcting method comprising the steps of:
   disposing a first circular loop coil and a second circular loop coil at positions spaced in a static magnetic field to be symmetrical with respect to a center of an imaging region of an MRI apparatus;
   disposing a third circular loop coil and a fourth circular loop coil having a larger diameter than that of said first and second circular loop coils at positions spaced in said static magnetic field direction to be symmetrical with respect to said center of said imaging region;
   generating a first corrective magnetic field in a first direction by said first circular loop coil, and generating a second corrective magnetic field in the same direction as said first direction of said second circular loop coil;
   generating a third corrective magnetic field in a second direction by said third circular loop coil, and generating a fourth corrective magnetic field in the same direction as said second direction by said fourth circular loop coil, wherein said second direction is opposite to said first direction; and
   providing said static magnetic field in a direction which is parallel to said first direction;
   thereby correcting second order static magnetic field components in the static magnetic field direction;
   wherein at least one of the ratios of electric currents and the turns of ratio of said first through fourth circular loop coils is determined so that zeroth order corrective magnetic field components in said static magnetic field direction cancel one another.

2. The method of claim 1, wherein said first and second circular loop coils are disposed substantially coplanar and outside one or more gradient coils.

3. The method of claim 1, wherein said third and fourth circular loop coils are disposed surrounding one or more magnetism conditioning plates.

4. The method of claim 1, wherein said static magnetic field is directed in a vertical direction.

5. A second order static magnetic field correcting method comprising the steps of:
   disposing a first circular loop coil and a second circular loop coil at positions spaced in a static magnetic field to be symmetrical with respect to a center of an imaging region of an MRI apparatus;

disposing a third circular loop coil and a fourth circular loop coil having a larger diameter than that of said first and second circular loop coil at positions spaced in said static magnetic field to be symmetrical with respect to said center of said imaging region;

generating a first corrective magnetic field in a first direction by said first circular loop coil, and generating a second corrective magnetic field in the same direction as said first direction by said second circular loop coil;

generating a third corrective magnetic field in a second direction by said third circular loop coil, and generating a fourth corrective magnetic field in the same direction as said second direction by said fourth circular loop coil, wherein said second direction is opposite to said first direction;

providing said static magnetic field in a direction which is parallel to said first direction;

thereby correcting second order static magnetic field components in the static magnetic field direction;

disposing three RF probes at different positions in a static magnetic field direction of an MRI apparatus, each of said probes having a small phantom capable of emitting an FID signal and a small coil combined;

transmitting RF pulses from said RF probes and receiving FID signals at a time when a magnetic field variation is to be measured;

determining frequencies $f_1$, $f_2$ and $f_3$ from said FID signals;

determining a second order static magnetic field component $\beta_2$ by solving the following simultaneous equations:

$$f_1 = \beta_0 + \beta_1 \cdot r_1 + \beta_2 \cdot r_1^2$$
$$f_2 = \beta_0 + \beta_1 \cdot r_2 + \beta_2 \cdot r_2^2$$
$$f_3 = \beta_0 + \beta_1 \cdot r_3 + \beta_2 \cdot r_3^2$$

wherein the positions of said RF probes are designated by $r_1$, $r_2$ and $r_3$; and adjusting corrective magnetic fields based on said second order static magnetic field component $\beta_2$.

6. A second order static magnetic field correcting method comprising the steps of:

disposing a first circular loop coil and a second circular loop coil at positions spaced in a static magnetic field to be symmetrical with respect to a center of an imaging region of an MRI apparatus;

disposing a third circular loop coil and a fourth circular loop coil having a larger diameter than that of said first and second circular loop coil at positions spaced in said static magnetic field to be symmetrical with respect to said center of said imaging region;

generating a first corrective magnetic field in a first direction by said first circular loop coil, and generating a second corrective magnetic field in the same direction as said first direction by said second circular loop coil;

generating a third corrective magnetic field in a second direction by said third circular loop coil, and generating a fourth corrective magnetic field in the same direction as said second direction by said fourth circular loop coil, wherein said second direction is opposite to said first direction;

providing said static magnetic field in a direction which is parallel to said first direction;

thereby correcting second order static magnetic field components in the static magnetic field direction;

disposing three RF probes at different positions in a static magnetic field direction of an MRI apparatus, each of said probes having a small phantom capable of emitting an FID signal and a small coil combined;

transmitting rF pulses from said RF probes and receiving FID signals at a time when a reference magnetic field is to be measured;

determining reference frequencies $f_{1r}$, $f_{2r}$ and $f_{3r}$ from said FID signals;

transmitting RF pulses from said RF probes and receiving FID signals at a time when a magnetic field variation is to be measured;

determining a second order magnetic field variation $\alpha_2$ by solving the following simultaneous equations:

$$f_1 - f_{1r} = \alpha_0 + \alpha_1 \cdot r_1 + \alpha_2 \cdot r_1^2$$
$$f_2 - f_{2r} = \alpha_0 + \alpha_1 \cdot r_2 + \alpha_2 \cdot r_2^2$$
$$f_3 - f_{3r} = \alpha_0 + \alpha_1 \cdot r_3 + \alpha_2 \cdot r_3^2$$

wherein the positions of said RF probes are designated by $r_1$, $r_2$ and $r_3$; and adjusting corrective magnetic fields based on said second order magnetic field component $\alpha_2$.

7. The method of claim 6, further comprising the steps of:

determining a zeroth order magnetic field variation $\alpha_0$; and adjusting a transmit frequency for an RF pulse and a receive detection frequency for an NMR signal based on said zeroth order magnetic field variation $\alpha_0$.

8. The method of claim 6, further comprising the steps of:

determining a first order magnetic field variation $\alpha_1$, and adjusting a gradient electric current based on said first order magnetic field variation $\alpha_1$.

9. An MRI apparatus comprising:

a first circular loop coil and a second circular loop coil disposed at positions spaced in a static magnetic field to be symmetrical with respect to a center of an imaging region, said first circular loop coil generating a first corrective magnetic field in a first direction, and said second circular loop coil generating a second corrective magnetic field in the same direction as said first direction;

said static magnetic field being in a direction parallel to said first direction;

a third circular loop coil and a fourth circular loop coil having a larger diameter than that of said first and second circular loop coils and disposed at positions spaced in said static magnetic field to be symmetrical with respect to the center of said imaging region, said third circular loop coil generating a third corrective magnetic field in a second direction, and said fourth circular loop coil generating a fourth corrective magnetic field in the same direction as said second direction, said second direction being opposite to said first direction; and means for applying corrective electric current to said first through fourth circular loop coils to generate said first through fourth corrective magnetic fields;

wherein at least one of the ratio of electric currents and the turns ratio of said first through fourth circular loop coils is determined so that zeroth order corrective magnetic field components in the static magnetic field direction cancel one another.

10. The apparatus of claim 9, wherein said first and second circular loop coils are disposed substantially coplanar with and outside of one or more gradient coils.

11. The apparatus of claim 9, wherein said third and fourth circular loop coils are disposed surrounding one or more magnetism conditioning plates.

12. The apparatus of claim 9, wherein said static magnetic field is provided in a vertical direction.

13. An MRI apparatus comprising:
   a first circular loop coil and a second circular loop coil disposed at positions spaced in a static magnetic field to be symmetrical with respect to a center of an imaging region, said first circular loop coil generating a first corrective magnetic field in a first direction, and said second circular loop coil generating a second corrective magnetic field in the same direction as said first direction;
   said static magnetic field being in a direction parallel to said first direction;
   a third circular loop coil and a fourth circular loop coil having a larger diameter than that of said first and second circular loop coils and disposed at positions spaced in said static magnetic field to be symmetrical with respect to the center of said imaging region, said third circular loop coil generating a third corrective magnetic field in a second direction, and said fourth circular loop coil generating a fourth corrective magnetic field in the same direction as said second direction, said second direction being opposite to said first direction;
   means for applying corrective electric current to said first through fourth circular loop coils to generate said first through fourth corrective magnetic fields;
   means for, under the condition that three RF probes are disposed at different positions in the static magnetic field direction, each said probes having a small phantom capable of emitting an FID signal and a small coil combined, transmitting RF pulses from said RF probes and receiving FID signals, and determining frequencies $f_1$, $f_2$ and $f_3$ from the FID signals; and
   means for determining second order static magnetic field component $\beta_2$ by solving the following simultaneous equations:

$$f_1 = \beta_0 + \beta_1 \cdot r_1 + \beta_2 \cdot r_1^2$$
   $$f_2 = \beta_0 + \beta_1 \cdot r_2 + \beta_2 \cdot r_2^2$$
   $$f_3 = \beta_0 + \beta_1 \cdot r_3 + \beta_2 \cdot r_3^2$$

wherein the positions of said RF probes are designated by $r_1$, $r_2$ and $r_3$, and adjusting the corrective magnetic fields based on said second order static magnetic field component $\beta_2$.

14. An MRI apparatus comprising:
   a first circular loop coil and a second circular loop coil disposed at positions spaced in a static magnetic field to be symmetrical with respect to a center of an imaging region, said first circular loop coil generating a first corrective magnetic field in a first direction, and said second circular loop coil generating a second corrective magnetic field in the same direction as said first direction;
   said static magnetic field being in a direction parallel to said first direction;
   a third circular loop coil and a fourth circular loop coil having a larger diameter than that of said first and second circular loop coils and disposed at positions spaced in said static magnetic field to be symmetrical with respect to the center of said imaging region, said third circular loop coil generating a third corrective magnetic field in a second direction, and said fourth circular loop coil generating a fourth corrective magnetic field in the same direction as said second direction, said second direction being opposite to said first direction;
   means for applying corrective electric current to said first through fourth circular loop coils to generate said first through fourth corrective magnetic fields;
   means for, under the condition that three RF probes are disposed at different positions in the static magnetic field direction, each of said probes having a small phantom capable of emitting an FID signal and a small coil combined, transmitting RF pulses from said RF probes and receiving FID signals at a time when a reference magnetic field is to be measured, and determining reference frequencies $f_{1r}$, $f_{2r}$ and $f_{3r}$ from the FID signals;
   means for, under the condition that three RF probes are disposed at different positions in the static magnetic field direction, each of said probes having a small phantom capable of emitting an FID signal and a small coil combines, transmitting RF pulses from said RF probes and receiving FID signals at a time when a magnetic field variation is to be measured, and determining frequencies $f_1$, $f_2$ and $f_3$ from the FID signals; and
   means for determining a second order magnetic field variation $\alpha_2$ by solving the following simultaneous equations:

$$f_1 - f_{1r} = \alpha_0 + \alpha_1 \cdot r_1 + \alpha_2 \cdot r_1^2$$
   $$f_2 - f_{2r} = \alpha_0 + \alpha_1 \cdot r_2 + \alpha_2 \cdot r_2^2$$
   $$f_3 - f_{3r} = \alpha_0 + \alpha_1 \cdot r_3 + \alpha_2 \cdot r_3^2$$

wherein the positions of said RF probes are designated by $r_1$, $r_2$ and $r_3$ and adjusting the corrective magnetic fields based on said second order magnetic field variation $\alpha_2$.

15. The apparatus of claim 14, further comprising:
   means for determining zeroth order magnetic field variation $\alpha_0$; and
   means for adjusting a transmit frequency for an RF pulse and a corrective detection frequency for an NMR signal based on said zeroth order magnetic field variation $\alpha_0$.

16. The apparatus of claim 14, further comprising:
   means for determining a first order magnetic field variation $\alpha_1$; and
   means for adjusting a gradient electric current based on said first order magnetic field variation $\alpha_1$.

* * * * *